US006307444B1

(12) United States Patent
Neumann et al.

(10) Patent No.: US 6,307,444 B1
(45) Date of Patent: Oct. 23, 2001

(54) FREQUENCY SIGNAL EQUALIZING DEVICE, SPECIALLY FOR A SATELLITE COMMUNICATIONS FACILITY

(75) Inventors: Christian Neumann; Matthias Klauda, both of Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/380,145

(22) PCT Filed: Jun. 11, 1997

(86) PCT No.: PCT/DE97/02580

§ 371 Date: Aug. 25, 1999

§ 102(e) Date: Aug. 25, 1999

(87) PCT Pub. No.: WO98/38690

PCT Pub. Date: Sep. 3, 1998

(30) Foreign Application Priority Data

Feb. 26, 1997 (DE) .............................................. 197 07 675

(51) Int. Cl.[7] .............................. H03H 5/00; H03H 7/30; H04B 3/04

(52) U.S. Cl. ........................... 333/28 R; 333/18; 375/229

(58) Field of Search .................................... 333/28 R, 18, 333/995; 375/229

(56) References Cited

U.S. PATENT DOCUMENTS

H1408 * 1/1995 Babbitt et al. ........................ 333/1.1
4,491,808 * 1/1985 Saito .................................. 333/28 R
5,172,084 * 12/1992 Fiedziuszko et al. ............... 333/204
5,616,538 * 4/1997 Hey-Shipton et al. .............. 505/210

FOREIGN PATENT DOCUMENTS

355067201A * 5/1980 (JP) .................................... 333/28 R

OTHER PUBLICATIONS

Mansour et al. "C–Band Externally–Equalized Superconductive Input Channel Filters." 1994 IEEE International Microwave Symposium–Digest. vol. 1. pp. 187–190 (May 23–27, 1994).*

Weigel et al. "Narrow–Band YBCO Superconducting Parallel–Coupled Coplanar Waveguide Band–Pass Filters At 10 GHZ." 1993 IEEE MTT–S International Microwave Symposium–Digest. vol. 3. pp. 1285–1288 (Jun. 14, 1993).*

R. Knerr. "A Microwave Circulator That's Smaller Than A Quarter." Bell Laboratories Record. vol. 51. No. 3, pp. 79–84 (Mar. 1973).

F. Huang. "Low Loss Quasitransversal Microwave Filters With Specified Amplitude And Phase Characteristics." IEE Proceedings: Microwaves, Antennas and Propagation. vol. 140. No. 6. pp. 433–440 (Dec. 1, 1993).*

* cited by examiner

*Primary Examiner*—Robert Pascal
*Assistant Examiner*—Kimberly E Glenn
(74) *Attorney, Agent, or Firm*—Kenyon & Kenyon

(57) ABSTRACT

An arrangement is described for the equalization of a frequency signal, the arrangement including a channel filter and an equalizer connected downstream of the channel filter, for a satellite communication system in particular. The equalizer is an at least partially superconductive reflection equalizer.

8 Claims, 3 Drawing Sheets

FREQUENCY SIGNAL EQUALIZING DEVICE, SPECIALLY FOR A SATELLITE COMMUNICATIONS FACILITY

FIELD OF THE INVENTION

The present invention relates to an arrangement for the equalization of a frequency signal, the arrangement including a channel filter and an equalizer connected downstream from the channel filter, for a satellite communication system in particular.

BACKGROUND INFORMATION

A conventional method for the transmission of information via a satellite link is to convert the information into high frequency signals and to transmit them. In order to be able to transmit a large amount of information simultaneously, several selectable frequency bands of the total frequency spectrum suitable for a transmission are used for the transmission. These high frequency signals are transmitted from an earth station to a satellite and from the satellite to the receivers. The transmitted signals are converted and amplified in the satellites. Since the broadband amplifiers themselves cannot be implemented, the signals are broken down into relatively narrow frequency bands. These signals are amplified and subsequently combined to form the output signal and then transmitted.

In this connection, it is disadvantageous that a so-called skew occurs between the low, medium and high frequency signal components within a narrow band frequency band. The skew results in corrupted signals when the signals are subsequently combined and amplified. A conventional method for balancing the skew is to guide the signals via an equalizer having a circulator. The transmitted signal is injected in the circulator and sent to an output terminal via controlled reflections within the circulator. This reduces the group delay of the signal, i.e., the transmission time of the low, medium and high frequency signal components of a signal takes place in a shorter time interval. The use of a microwave equalizer in satellite communication systems is described in, for example, C. M. Kudsia, Synthesis of Optimum Reflection-Type Microwave Equalizers, RCA Review, September 1997, page 571 ff. Waveguide resonators or dielectric resonators having a downstream, short-circuited, double-tuned circuit filter are customarily used for this purpose. A disadvantage of such resonators is their relatively large size and, consequently, the use of a large number of such resonators in a satellite communication system, especially, in a satellite itself, is limited.

The manufacture of filters using superconductive planar technology is also generally known. In contrast to conventional filters and equalizers, they represent a considerable savings in space and weight.

SUMMARY OF THE INVENTION

An arrangement according to the present invention offers an advantage that, in addition to a reduction of space and weight, a further reduction of group delay is also achieved. As a result of the equalizer being made up of an at least partially superconductive reflection equalizer, preferably including a planar circulator and a superconductive reflection filter, equalization of the signals and reduction of the group delay can take place in an extremely small installation space due to the use of components based on superconductive planar technology. The low frequency and high frequency signal components of the signal of a certain frequency band to be transmitted are superimposed via the reflection filter in such a way that their delay is approximated to the delay of the medium frequency signal component, resulting in a drastic reduction of the variation of the group delay.

DETAILED DESCRIPTION

Figure 1:
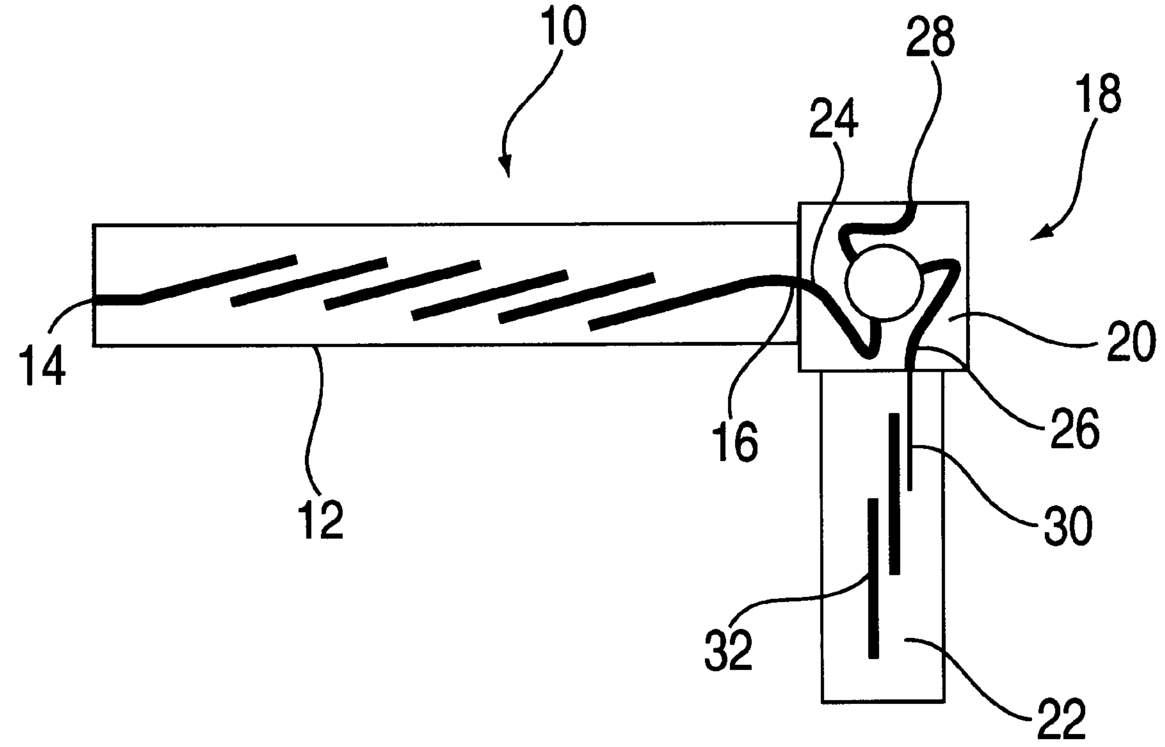
FIG. 1 shows a schematic view of an embodiment of an arrangement according to the present invention for the equalization of a frequency signal.

FIG. 1 shows an embodiment of an arrangement 10 according to the present invention for the equalization of a frequency signal in schematic form. Arrangement 10 has a channel filter 12, a frequency signal being present at its input terminal 14. An equalizer 18 is connected to an output terminal 16 of channel filter 12. Equalizer 18 has a circulator 20 and a reflection filter 22. Circulator 20 is connected to output terminal 16 of channel filter 12 via a first terminal 24. A second terminal 26 of circulator 20 is connected with reflection filter 22 and the equalized frequency signal is present at an output terminal 28.

Channel filter 12, circulator 20 and reflection filter 22 are implemented in superconductive planar technology. Since the design and mode of functioning of components designed using superconductive planar technology is of general knowledge, they will not be discussed in great detail here. Channel filter 12 is a B-circuit filter, for example. Reflection filter 22 is a microstrip filter or a coplanar filter, for example, while circulator 20 is a Y-microstrip line circulator, for example.

Reflection filter 22 has a coupling line 30 which is connected to terminal 26 of circulator 20. In addition, at least one pair of coupled planar resonators 32 is provided.

Coupling line 30 is resistance-adapted to circulator 20, its terminal 26 in particular. As a result, the opening width of terminal 26 is adapted to the opening width of coupling line 30 so that an optimum terminal transition is obtained with respect to reflection characteristics. This results in that reflection losses are avoided.

Arrangement 10 shown in FIG. 1 shows the following function:

A frequency signal present at input terminal 14 is band-limited by channel filter 12, meaning that only a narrow frequency band is filtered out. The input signal is in the gigahertz range (microwave), for example, from approximately 3.4 GHz to approximately 4.2 GHz, for example. The narrow frequency band is filtered out of this input signal by channel filter 12. Filtering takes place according to the design of channel filter 12. This narrow frequency band is to be supplied to an amplifier downstream of output terminal 28 of arrangement 10. Due to their varying frequencies, the individual frequencies of the filtered out narrow frequency band have a varying delay so that their amplification and subsequent recombination into the amplified output signal would result in corrupted signals. Consequently, the low and high frequency signal components of the frequency signal present at output terminal 16 are slower than the medium frequency signal components. On the whole, a group skew of approximately 20 ns as to approximately 40 ns is produced.

Figure 2:
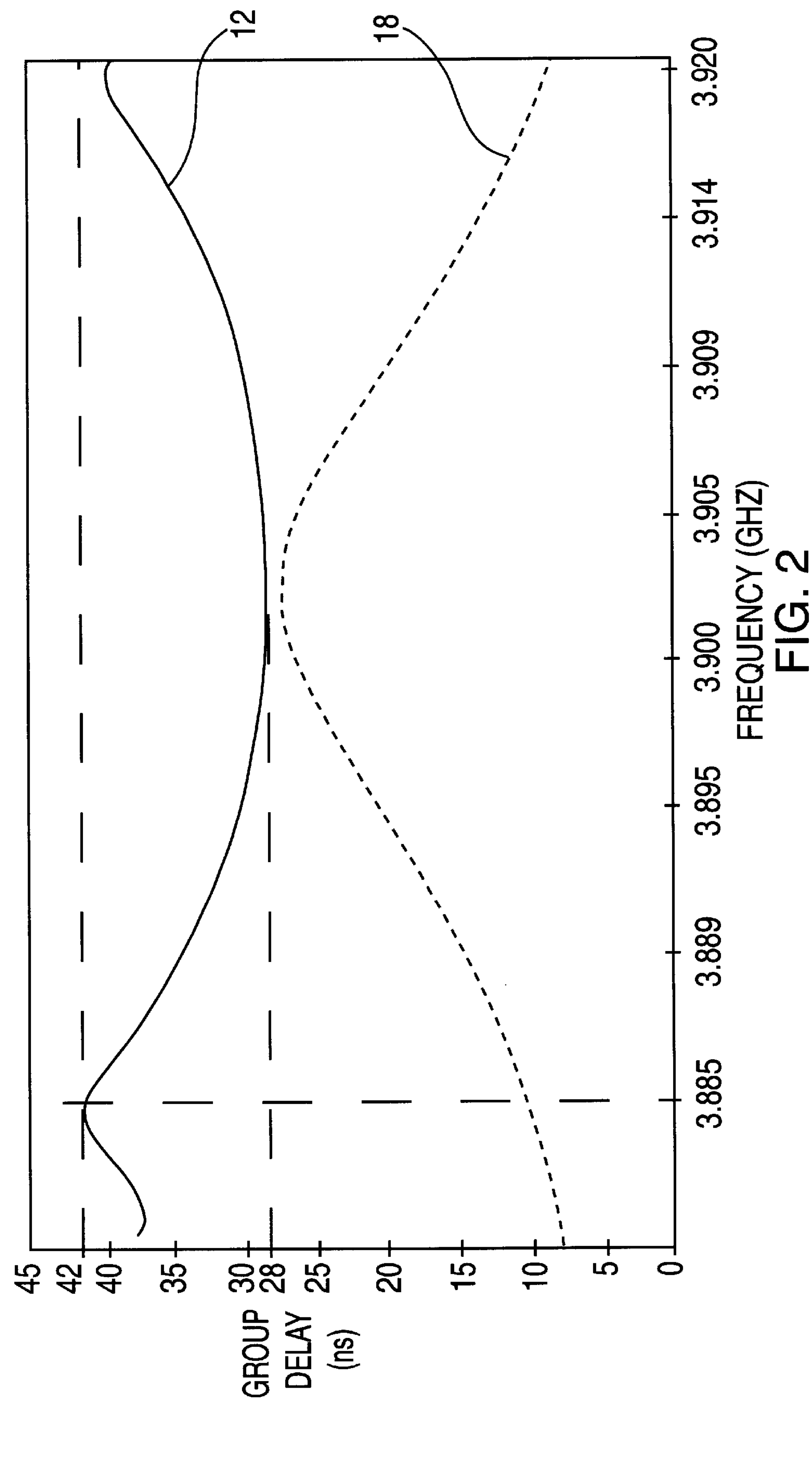
FIG. 2 shows a representation of a group delay of individual components of the arrangement according to the present invention.

The group delay of the frequency components of the frequency signal present at input terminal 14 is plotted against the frequency in FIG. 2 as an example. The upper continuous line illustrates the group delay in channel filter 12. It is evident that a skew of approximately 15 ns (from approximately 28 ns to approximately 42 ns) exists between the low frequency range at approximately 3.885 GHz, as well as the high frequency range at approximately 3.920 GHz and the medium frequency range at approximately 3.900 GHz to approximately 3.905 GHz.

The individual signal components are fed into circulator 20. Via circulator 20, the frequency signals are conducted to terminal 26 and supplied from there to planar resonators 32 via coupling line 30. The signals are reflected by planar resonators 32 and in turn supplied to the resonator of circulator 20 via coupling line 30 and terminal 26. From there, a reflection to output terminal 28 of circulator 20 takes place.

Figure 3:
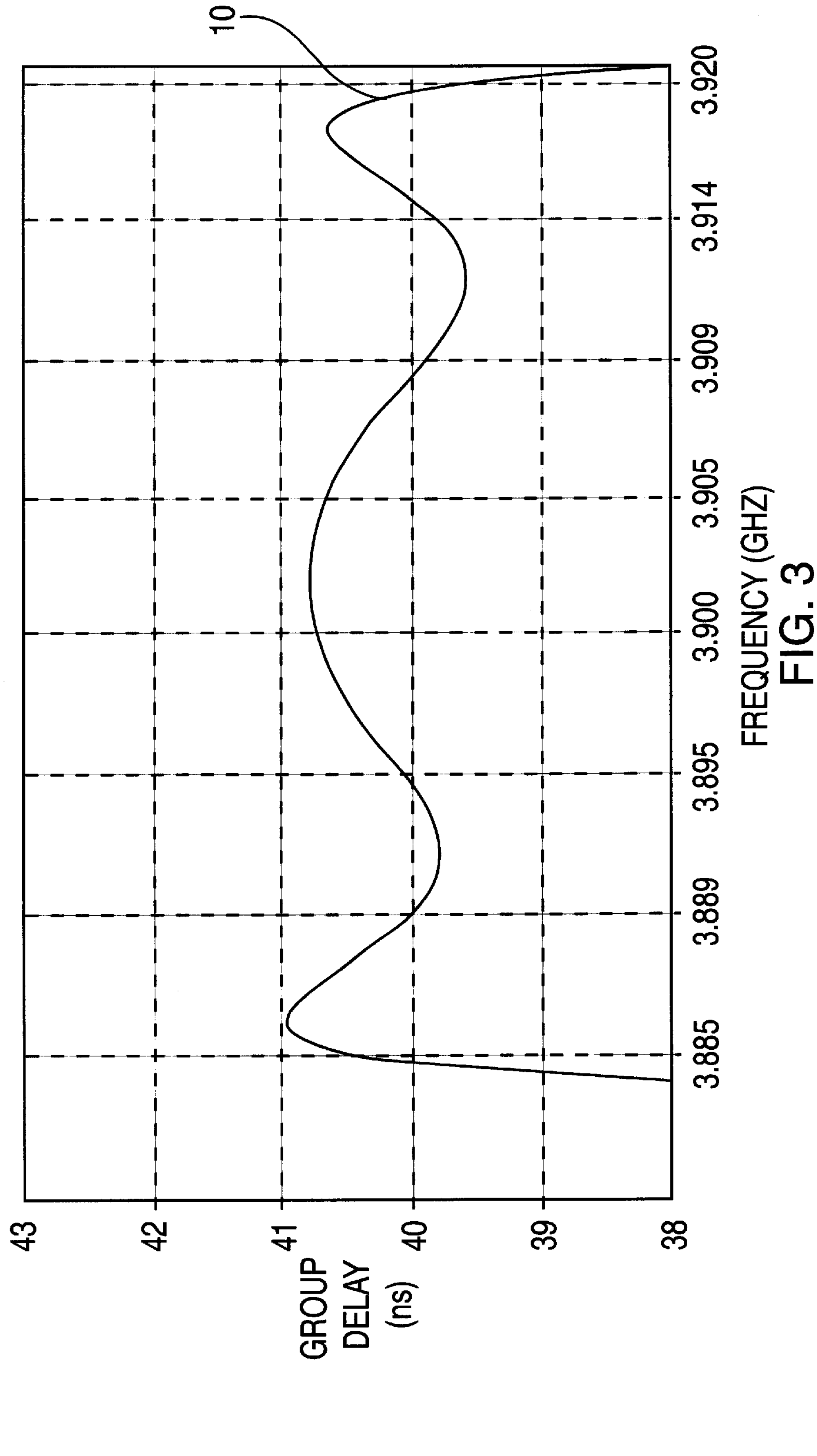
FIG. 3 shows a representation of a group delay of an overall arrangement according to the present invention.

Different reflection conditions occur in reflection filter 22 for the low, medium and high frequency components of the subsignals. This results in a group delay of the individual sub-frequency signals, as shown, for example, by the dotted line in FIG. 2. Equalizer 18, which is made up of circulator 20 and reflection filter 22, is designed in such a way that the delay of the low frequency and high frequency signals is less than the delay of the medium frequency signal components. Observed via the frequency band, the delay of equalizer 18 exhibits an ascending parabola in the regions in which the delays in channel filter 12 exhibit a descending parabola. On the other hand, the delay in equalizer 18 exhibits a descending parabola in the frequency range in which the delay in the channel filter exhibits an ascending parabola. The group delay signal against frequency curve shown in FIG. 3 results from this design according to the present invention. Superimposing the delays of the individual frequency components results in a parabolic curve against the frequency which shows a group skew, i.e., the interval between the slowest delay to the fastest delay, of approximately 3 ns (from approximately 38 ns to approximately 41 ns).

It is clear that the group skew as a function of the frequency of the arrangement 10 is drastically reduced. Depending on the bandwidth of the frequency signal, group delay times of less than approximately 2 ns can be obtained. The skew within a channel does not result in any significant corruption during a subsequent amplification and combination of the output information. In addition to the drastic reduction of group delay time, the design of arrangement 10 based on superconductive planar technology results in a savings of space and weight. Such arrangements 10 are suitable for use in satellites of a satellite communication system.

What is claimed is:

1. An arrangement for equalizing a frequency signal, comprising:

a planar channel filter; and a planar equalizer coupled downstream to the channel filter equalizing the frequency signal by reducing a variation in a group delay of the frequency signal, the equalizer being a reflection equalizer, at least a part of the reflection equalizer being superconductive, the reflection equalizer including a reflection filter, the reflection filter being in a form of at least one of a microstrip filter and a co-planar filter.

2. The arrangement according to claim 1, wherein the arrangement is for use in a satellite communication system.

3. The arrangement according to claim 1, wherein the planar equalizer includes a planar circulator.

4. The arrangement according to claim 3, wherein the planar circulator includes a microstrip circulator.

5. The arrangement according to claim 3, wherein the reflection filter is coupled to the planar circulator via a coupling line.

6. The arrangement according to claim 5, wherein the coupling line is resistance-adapted.

7. The arrangement according to claim 3, wherein the reflection filter includes at least one planar resonator.

8. The arrangement according to claim 1, wherein the reflection equalizer is superconductive.

* * * * *